(12) United States Patent
Eccles (10) Patent No.: US 7,143,376 B1
(45) Date of Patent: Nov. 28, 2006

(54) METHOD AND APPARATUS FOR DESIGN VERIFICATION WITH EQUIVALENCY CHECK

(75) Inventor: Robert E. Eccles, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 338 days.

(21) Appl. No.: 10/792,153

(22) Filed: Mar. 2, 2004

Related U.S. Application Data (60) Provisional application No. 60/452,143, filed on Mar. 4, 2003.

(51) Int. Cl.
  *G06F 17/50* (2006.01)
(52) U.S. Cl. .............................. 716/5; 716/16; 716/18
(58) Field of Classification Search .................... 716/5, 716/16, 18
  See application file for complete search history.

(56) References Cited

U.S. PATENT DOCUMENTS

| | | | | |
|---|---|---|---|---|
| 5,594,657 A * | 1/1997 | Cantone et al. | ............... | 716/16 |
| 5,854,752 A * | 12/1998 | Agarwal | ........................ | 716/7 |
| 6,021,513 A * | 2/2000 | Beebe et al. | ................ | 714/726 |
| 6,216,257 B1 * | 4/2001 | Agrawal et al. | .............. | 716/16 |
| 6,311,316 B1 * | 10/2001 | Huggins et al. | .............. | 716/12 |
| 6,477,683 B1 * | 11/2002 | Killian et al. | .................. | 716/1 |
| 6,668,237 B1 * | 12/2003 | Guccione et al. | ........... | 702/119 |
| 6,889,368 B1 * | 5/2005 | Mark et al. | ...................... | 716/4 |
| 6,912,706 B1 * | 6/2005 | Stamm et al. | ................ | 716/17 |
| 7,085,976 B1 * | 8/2006 | Shirazi et al. | .............. | 714/725 |
| 2003/0200520 A1 * | 10/2003 | Huggins et al. | .............. | 716/16 |
| 2004/0088691 A1 * | 5/2004 | Hammes et al. | ............. | 717/158 |
| 2006/0041872 A1 * | 2/2006 | Poznanovic et al. | ......... | 717/140 |
| 2006/0053404 A1 * | 3/2006 | Allen et al. | .................... | 716/16 |

OTHER PUBLICATIONS

Chen et al., "Design Verification of FPGA Implementations", IEEE Design & Test of Computers, vol. 16, No. 2, Apr.-Jun. 1999, pp. 66-73.*
Brand, "Verification of Large Synthesized Designs", 1993 IEEE/ACM International Conference on Computer-Aided Design, Nov. 7, 1993, pp. 534-537.*
Xilinx, Inc.; Application Note, XAPP108; "Chip-Level HDL Simulation Using the Xilinx Alliance Series"; May 21, 1998 (Version 1.0); available from Xilinx, Inc., 2100 Logic Drive, San Jose, California 95124, pp. 1-15.
Altera; Application Note 296; "Using Verplex Conformal LEC for Formal Verification of Design Functionality"; Jan. 2003, Ver. 1.0; available from Altera Corporation; pp. 1-14.

(Continued)

*Primary Examiner*—Phallaka Kik
(74) *Attorney, Agent, or Firm*—Kim Kanzaki; W. Eric Webostad (57) ABSTRACT

Method and apparatus for design verification with equivalency checking is described. More particularly, an integrated circuit design for a device having programmable logic is obtained, and a test case design having one or more test patterns is obtained to test the integrated circuit design. Memory states for the test patterns are obtained and applied to configure at least a programmable logic portion of the integrated circuit design with at least one test pattern to provide a configured design. Equivalency checking with the at least one test pattern and the configured design may be done to determine if the configured design is functionally equivalent to the at least one test pattern.

31 Claims, 5 Drawing Sheets

OTHER PUBLICATIONS

Xilinx, Inc.; Application Note, XAPP413; "Xilinx/Verplex Conformal Verification Flow"; Oct. 2, 2001 (Version 1.1); available from Xilinx, Inc., 2100 Logic Drive, San Jose, California 95124; pp. 1-10.

Xilinx, Inc.; Application Note, XAPP414; "Xilinx/Synopsys Formality Verification Flow"; Jan. 21, 2002 (Version 1.3); available from Xilinx, Inc., 2100 Logic Drive, San Jose, California 95124; pp. 1-15.

IEEE Verilog(TM) HDL Language Reference Manual Project (LRM); Chapter 7.6; downloaded from http://www-ee.eng.hawaii.edu/~msmith/ASICs/HTML/Verilog/Verilog.htm; Feb. 24, 2004; pp. 1-14.

Xilinx, Inc.; Table 2-1 "Design Verification"; downloaded from http://toolbox.xilinx.com/docsan/xilinx5/data/docs/dev/dev0015_6.html; Feb. 28, 2003, pp. 1-9.

* cited by examiner

METHOD AND APPARATUS FOR DESIGN VERIFICATION WITH EQUIVALENCY CHECK

CROSS-REFERENCE TO RELATED APPLICATIONS

This application claims the benefit of U.S. Provisional Application No. 60/452,143, filed on Mar. 4, 2003.

FIELD OF THE INVENTION

One or more aspects of the invention relate generally to design verification with equivalency checking and, more particularly, to design verification with equivalency checking for programmable logic devices.

BACKGROUND OF THE INVENTION

Programmable logic devices ("PLDs") exist as a well-known type of integrated circuit ("IC") that may be programmed by a user to perform specified logic functions. There are different types of programmable logic devices, such as programmable logic arrays ("PLAs") and complex programmable logic devices ("CPLDs"). One type of programmable logic device, called a field programmable gate array ("FPGA"), is very popular because of a superior combination of capacity, flexibility, time-to-market, and cost.

An FPGA typically includes an array of configurable logic blocks ("CLBs") and programmable input/output blocks ("IOBs"). The CLBs and IOBs are interconnected by a programmable interconnect structure. The CLBs, IOBs, and interconnect structure are typically programmed by loading a stream of configuration data ("bitstream") into internal configuration memory cells that define how the CLBs, IOBs, and interconnect structure are configured. CLBs and IOBs form the programmable part of an FPGA referred to as the "FPGA fabric", which is subject to program control of the configuration memory cells. FPGAs may also contain other types of known circuitry.

In order to ensure operability, an FPGA is tested prior to release to customers. Accordingly, it would be desirable and useful to provide design verification using test patterns prior to product release.

SUMMARY OF THE INVENTION

An aspect of the invention is a method for checking whether a programmable logic device functions properly when configured. An integrated circuit design, including at least a programmable logic portion, for the programmable logic device is obtained. At least one test pattern to test at least the programmable logic portion is obtained. Memory states for configuring the programmable logic device are obtained. The memory states are applied to at least the programmable logic portion to configure the programmable logic portion with at least one test pattern to provide a configured design. The configured design is equivalency checked with at least one test pattern.

An aspect of the invention is an apparatus for checking whether a programmable logic device functions properly when configured. Database means contain an unconfigured design for the programmable logic device and test patterns. A placer and router respectively place and route the test patterns to provide network nodal information for the test patterns, and memory states means for obtaining memory states for the test patterns from the network nodal information. A level abstractor applies the memory states for the test patterns to the unconfigured design to configure a portion of the unconfigured design with the test patterns to provide a configured design. An equivalency checker compares the test patterns with the configured design.

An aspect of the invention is a method for checking whether a programmable logic device functions properly when configured. An integrated circuit design for the programmable logic device is obtained. A test case design is obtained. The test case design is synthesized. Memory states from the test case design synthesis are obtained. A first logic block and a second logic block from the integrated circuit design are obtained. The first and the second logic block are respectively configured with a first and a second portion of the test case design, and first and second information from the memory states is respectively applied to the logic blocks. The first logic block and the second logic block are hierarchically combined to provide a design abstraction. The design abstraction is equivalency checked with the test case design.

An aspect of the invention is a method for checking whether a programmable logic device functions properly when configured. A logic block and memory states are obtained. The memory states are filtered responsive to the logic block to provide filtered memory states, which are translated to the logic block. A cell of the logic block is parsed out from a hierarchical relationship with another cell, and the cell of the logic block is renamed.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for configuring a programmable logic device using an equivalency checker is described. One or more aspects in accordance with the invention are described in terms of a field programmable gate array (FPGA). While specific reference is made to an FPGA, those skilled in the art will appreciate that one or more aspects of the invention may be used in other types of programmable logic devices that complex programmable logic devices (CPLDs), as well as other integrated circuits having programmable logic.

Figure 1:
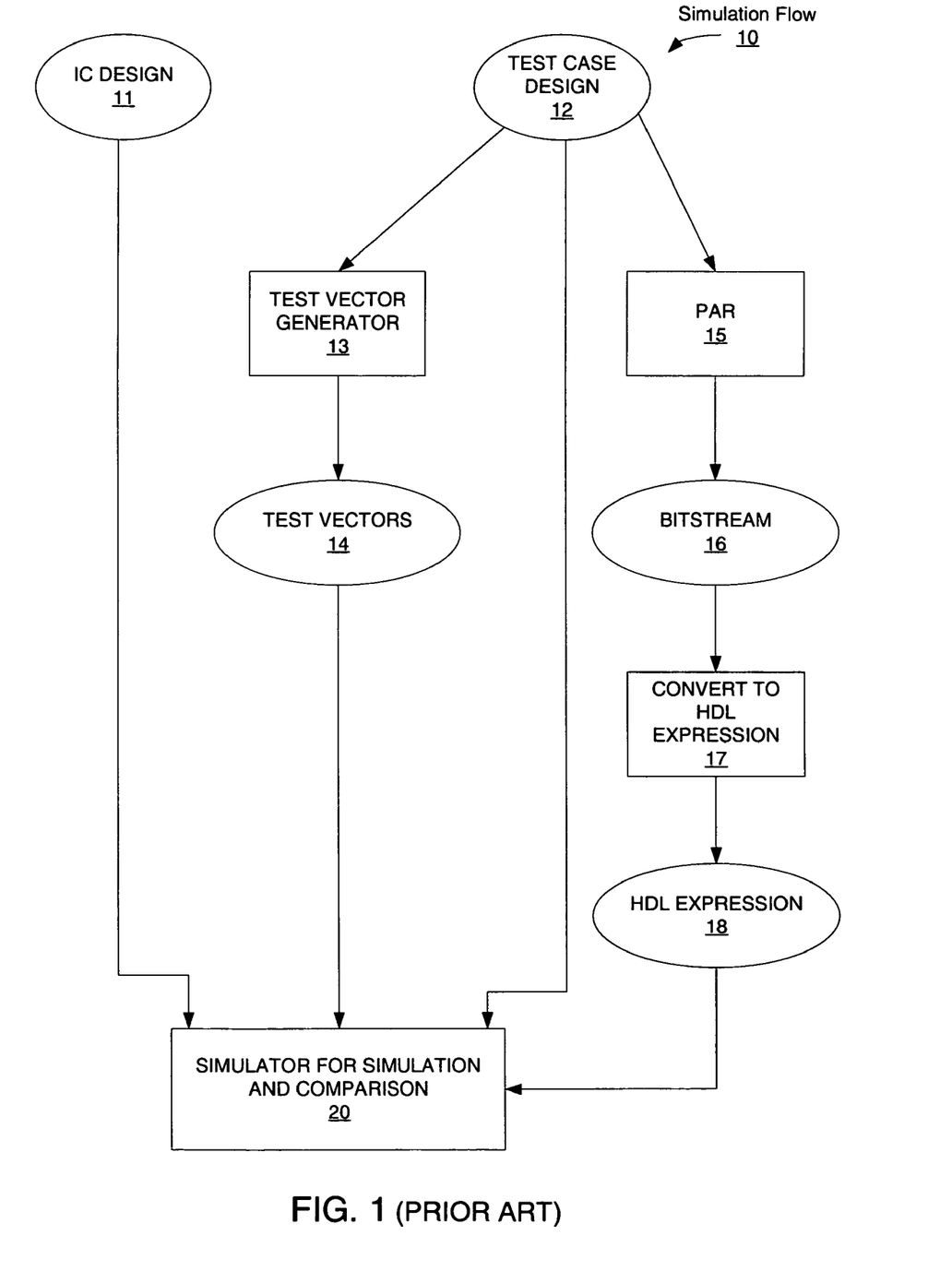
FIG. 1 depicts a flow diagram of a simulation check flow of the prior art.

FIG. 1 depicts a flow diagram of a simulation check flow 10 of the prior art. To verify an integrated circuit design 11, such as for an FPGA, will function correctly when configured with customer design or a test case design ("a test case design") 12 simulation is used. For example, a test case design 12 may be a collection of circuits, for implementing a customer application. Simulation is used to verify that each test case design circuit is functionally equivalent to its one or more instances in an integrated circuit design, as described below in additional detail.

Each circuit of a test case design 12 is generated, for example in a form of a hardware description language ("HDL") such as Verilog or Very High Speed Integrated Circuit ("VHSIC") HDL ("VHDL"), or a synthesizable programming language such as SystemC or C/C++, to provide a hardware description for synthesis into an actual interconnected circuit data. Alternatively, a test case design could be specified as a list of networks, including elements in each network ("netlists"), or it could be specified by a schematic. Netlists can be created automatically from a schematic capture program. For clarity, reference is made hereafter to HDL to include any hardware description language whether a classic HDL or a programming language or a combination thereof.

To synthesize an HDL description of a circuit, conventionally placer and router tools are used for placing circuit elements and routing signals. The result of placing and routing ("PAR") 15 is a circuit bitstream and map file 16 covering each individual network in a test case design. However, to reduce simulation vector count and run time, a list of nodes and their states for each test case network is obtained and converted 17 from such bitstream and map file into an HDL expression 18.

HDL expression 18 is provided to simulator 20 and used to provide memory cell states for programming a PLD of integrated circuit design 11 provided to simulator 20 to function as one or more test case design circuits 12 provided to simulator 20. Integrated circuit design 11 and test case design 12 may be provided to simulator 20 as a netlist. Classically, a netlist is generated at a transistor-level or gate-level, or a combination thereof, and is an HDL textual description of a circuit.

Each circuit of a test case design 12 is provided to simulator 20 and test vector generator 13. Test vector generator 13 is used to provide test vectors 14 that may be used as stimulus for simulations by simulator 20 of test case design circuits 12, as described below in additional detail. Test vector generator 13 generates test vectors 14 in a known manner. These test vectors 14 may be applied to test case design circuits 12 and a configured PLD simulation 20 to elicit a response, namely, respective test data.

To verify that a test case design circuit 12 functions equivalently to a version thereof configured into an integrated circuit design 11, the above-mentioned inputs are used for setting up two simulations and applying stimulus in simulator 20 for comparison.

Comparison is made based on response to test vector stimulus to the two simulations. For example, one simulation is generated for the integrated circuit design from a netlist, where memory cell states are set from HDL expression 18. In other words, for the integrated circuit simulation, memory cell states for each test case design circuit are derived from a translated place-and-route ("PAR") output to program such integrated circuit design to mimic such test case design circuit. The other simulation is that of the test case design circuits, which is a simulation of circuits in contrast to a simulation of configured FPGA fabric. Accordingly, in response to test vector stimulus, it may be determined by comparison of simulation results whether the integrated circuit design as configured for a test case design produces the same results as the test case design.

This type of co-simulation on a simulator consumes a substantial amount of time ("runtime"). Additionally, there may be insufficient time to generate and simulate a complete set of test vectors, thereby not having complete vector coverage for verification of functional equivalence. In addition, test vectors can be incomplete due to human error.

Additionally, memory demands of simulators can be substantial. It is possible to exceed the capability of 32-bit simulator programs with respect to virtual memory address space. Simulators available just recently allow for 64-bit addressable virtual memory. However, 64-bit simulators are slower generally than 32-bit simulators and may not always be available.

To overcome one or more of the above limitations of simulations, equivalency checking may be used for verification, as described below.

Figure 2:
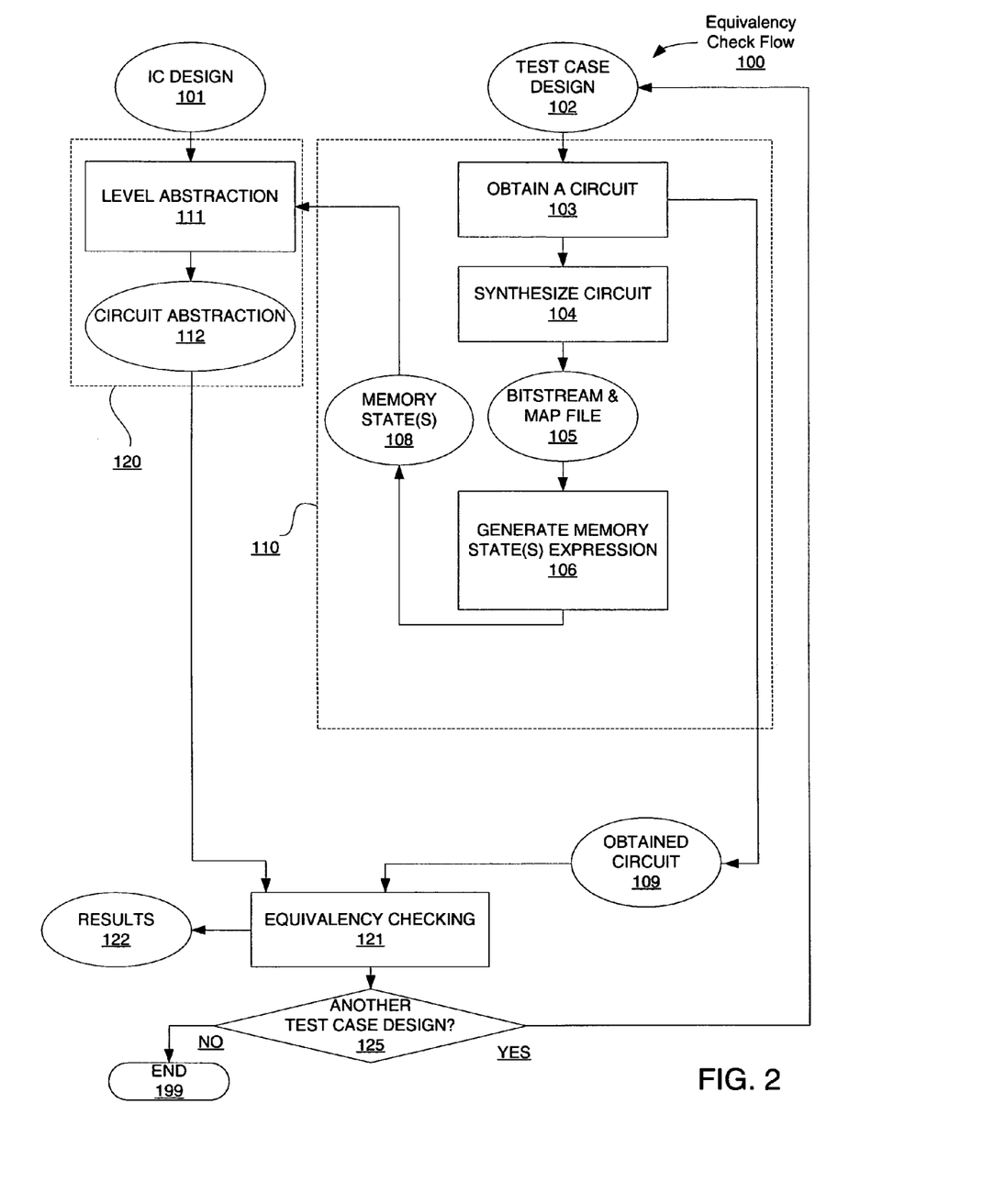
FIG. 2 depicts a flow diagram of an exemplary embodiment of an equivalency check flow.

FIG. 2 depicts a flow diagram of an exemplary embodiment of an equivalency check flow 100. Input data to equivalency check flow 100 includes an integrated circuit ("IC") design 101 and test case design 102. IC design 101 is provided to circuit abstraction portion 120.

Test case design 102 input is provided to circuit/memory state portion 110. An obtained circuit output 109 from portion 110 is provided for equivalency checking at 121, which may be done with an equivalency checker. One or more memory states output 108 for obtained circuit output 109 is/are provided to circuit abstraction portion 120.

Continuing the example from above, integrated circuit design 101 is a design of an FPGA, and test case design 102 is a circuit or a collection of circuits that may be considered a test pattern for a customer application, whether such test pattern is an actual design target or a collection of representative circuits for an actual design target. Circuits of test case design 102 include combinations of gates forming logic functions. For example, a circuit of test case design 102 may be any kind of digital logic including flip-flops, combinatorial logic, registers, SRAMs, shift registers, look up table RAMs, carry logic, or any combination thereof. In addition to digital logic, analog circuitry may be part of a test case design with use of behavioral code for example. However, it should be understood that by reducing or minimizing complexity of test case design circuits, runtime is reduced.

FPGA design 101 may be input in any of a variety of known forms, which may be used directly, or post conversion to an acceptable form, for use with equivalency checker 121. Examples of known forms, or levels of abstraction, include an HDL transistor-level netlist, a register-transfer-level (RTL) netlist, a gate-level netlist, or combination thereof.

Equivalency checking 121 may be done with a known circuit equivalency checking software tool that may be run on a computer platform. Examples of commercially available level translating software tools that may be used include Synopsys Formality, CSI DynaModel, TNI-Valiosys TLL, and Verplex LTX. Conventionally, equivalency checkers operate only at gate or higher levels of abstraction. Thus, designs provided at a level of abstraction lower than gate level, such as transistor level or lower, need to be up-converted to a level of abstraction compatible with the equivalency checker.

As some equivalency checkers operate only with RTL or gate-level descriptions, for clarity it will be assumed that equivalency checker uses only gate-level input, though it will be apparent that other inputs can be used. Notably, one or more equivalency checkers are capable of doing abstraction level translation in addition to equivalency checking. Additionally for clarity, it will be assumed that FPGA design 101 and test case design 102 are input as an HDL transistor-level netlist, though other forms of textual descriptions of a circuit may be used.

Level abstraction at 111 uses in part FPGA design 101 as input and in part abstracts that input to a level that may be processed by an equivalency checker. Level abstraction at 111 may be done with a known level abstracting software tool that may be run on a computer platform. Examples of commercially available level translating software tools that may be used include Synopsys Formality, CSI DynaModel, TNI-Valiosys TLL, and Verplex LTX.

Continuing the example, level abstraction at 111 uses a transistor-level circuit description or abstraction as partial input and provides a gate-level circuit description or abstraction in response. Notably, some level abstractors can output an RTL or a gate-level abstraction in response to a transistor-level description. However, for clarity as stated above, equivalency checking at 121 is assumed to process only register-transfer-level input, so for continuity of example, it is assumed that level abstracting at 111 output, namely, circuit abstraction 112, is a register-transfer-level circuit abstraction.

To provide each circuit abstraction 112, a respective circuit description from test case design 102 is used. Such a circuit description is obtained at 103. Each circuit description obtained at 103 is provided as a circuit to be checked, namely, obtained circuit output 109, for equivalency checking at 121, and is synthesized at 104. Continuing the above example, it is assumed that an HDL transistor-level netlist obtained at 103 is synthesizable. Synthesizing of a circuit description 103 is done with conventional place and route software tools that may be run on a computer platform. Examples of commercially available level translating software tools that may be used include Synopsys Formality, CSI DynaModel, TNI-Valiosys TLL, and Verplex LTX.

Output from synthesis at 104 is a binary representation ("bitstream") of a placed and routed circuit for a circuit description obtained at 103. Bitstream output and map file 105 from synthesis 104 is provided for analysis at 106. Analysis of a map file or a bitstream 105 may be done to obtain nodes and states of such nodes for test case design circuits or networks. Notably, this map file is available as an output of PAR, for example, PAR tools that are sold for FPGAs may be used.

Memory state or states ("memory states") output 108 are generated from bitstream/map file analysis at 106. This analysis extracts memory states for a circuit obtained at 103; to program FPGA design 101. Memory states output 108 is a list of nodes and their configured states.

Continuing the above-mentioned example, level abstraction at 111 accepts certain forms of input, namely, in the above example an HDL transistor-level input, accordingly at 106 memory state information is translated from binary or map file textual listing into a form usable with level abstraction at 111, namely, for continuity of the example an HDL transistor-level compatible output. For example, for Verilog, memory states output 108 is one or more force statements to force outputs of configured memory cells to specified values. However, it should be understood that memory states output 108 is not necessarily abstraction level dependent in the sense that no network elements are expressed, rather network node states are expressed.

Figure 6:
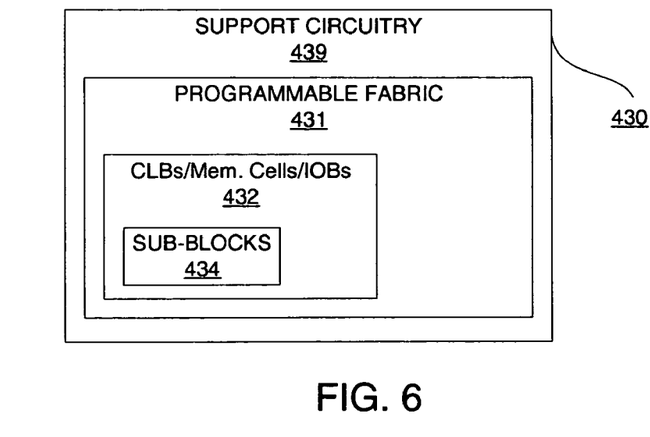
FIG. 6 is a block diagram of an exemplary embodiment of a programmable logic device design.

Memory states output 108 is provided at 111 for level abstraction. With reference to FIG. 6, where there is shown a block diagram of an exemplary embodiment of a programmable logic device design, such as an FPGA design, 430, equivalency check flow 100 is further described. For example, a level abstractor having access to FPGA design 101 receives memory state information in the form of memory states output 108 to configure an individual portion of FPGA fabric 431, such as one or more programmable "logic blocks" 432 or "sub-blocks" 434 of FPGA fabric 431, where a logic block 423 or sub-block 434 comprises programmable logic, such as in a CLB and associated memory cells. Additionally, a logic block or sub-block may comprise one or more IOBs.

For example, FPGA fabric 431 is configured as an HDL transistor-level description of a circuit obtained at 103 associated with this iteration of memory states output 108. In other words, level abstraction is used with a textual description of at least an unconfigured portion of an FPGA to program that unconfigured portion with a test pattern and abstract that configured portion into a level of abstraction compatible for equivalency checking at 121, namely, circuit abstraction 112. Continuing the above example, circuit abstraction 112 is a gate-level or register-transfer-level abstraction. Furthermore, as described below in additional detail, all test patterns may be configured into FPGA design fabric 431 for storing a collection of configured test patterns in FPGA design fabric 431.

Setting memory output for configuring a portion of an FPGA design may optionally be done at equivalency checking 121. However, a customer application may not use all available circuitry for FPGA design 101. Thus, it would cost unnecessary runtime to process unused CLBs 432 or IOBs 433. Additionally, it would cost unnecessary runtime to process unused FPGA hardwired support circuits 439, such as digital clock managers or modules ("DCMs"), or one or more embedded cores, such as one or more microprocessors, digital signal processors, memories, microcontrollers, and the like. Thus, it may be beneficial in terms of runtime to set memory outputs at level abstraction 111, as unused circuitry is given an opportunity to drop out of circuit abstraction 112. Each circuit obtained is provided as output 109 for comparison with a configured abstracted counterpart 112.

Equivalency checking at 121 is done by comparing a Boolean expression for a circuit abstraction 112 with one for a non-FPGA fabric version provided as obtained circuit output 109 for functional equivalence. More particularly, comparing may be done with a data structure that represents both Boolean combinatorial logic function and delays associated with registers, such as a Binary Decision Diagram ("BDD") or "BDD Boolean." Results 122 for each such comparison are provided. Accordingly, it should be appreciated that because test vectors need not be employed with equivalency checking, equivalency checking avoids dependence on test vector coverage. Additionally, equivalency checking may be used to reduce runtime, as well as memory usage, as compared with simulation checking.

After equivalency checking at 121, a check for another test case design to process may be made at 125. If another test case design is to be processed, it is provided as input 102. If, however, another test case design is not to be processed, equivalency checking flow 100 ends at 199.

While it is possible to equivalency check comparing one configured circuit at a time, it is less beneficial in terms of runtime as compared with doing a top-level abstraction. A hierarchical abstraction may increase abstraction tool capacity. Additionally, identically configured logic blocks only need be abstracted once if a top-level abstraction is used. Thus, a top-level combination of Boolean expressions for all circuit abstractions 112 for comparison with each obtained circuit 109 is more efficient in terms of runtime.

Level abstraction 111 causes network flattening. Network flattening may be used in order to simplify large designs. By simplifying the design, larger designs may be handled more efficiently. For example, circuit abstraction 111 may be performed on logic blocks of IC design 101, which may be used for hierarchically combining as described below. Moreover, one or more of FPGA design 101 and test case design 102 may be input at a level of abstraction that an equivalency checker at 121 can directly process to avoid or reduce abstraction level translation.

Notably, an application for verifying design of a proposed integrated circuit design of an FPGA has been described. However, other applications may be used, including verifying functionality of an integrated circuit design with one or more incremental design changes, and verifying functionality of an existing integrated circuit design—such as for debugging. In this latter application, as one or more problem circuits may be used as a test pattern, which is used as test case design input 102 for arriving at an equivalency check of an RTL or gate-level version configured with such test pattern.

Figure 3:
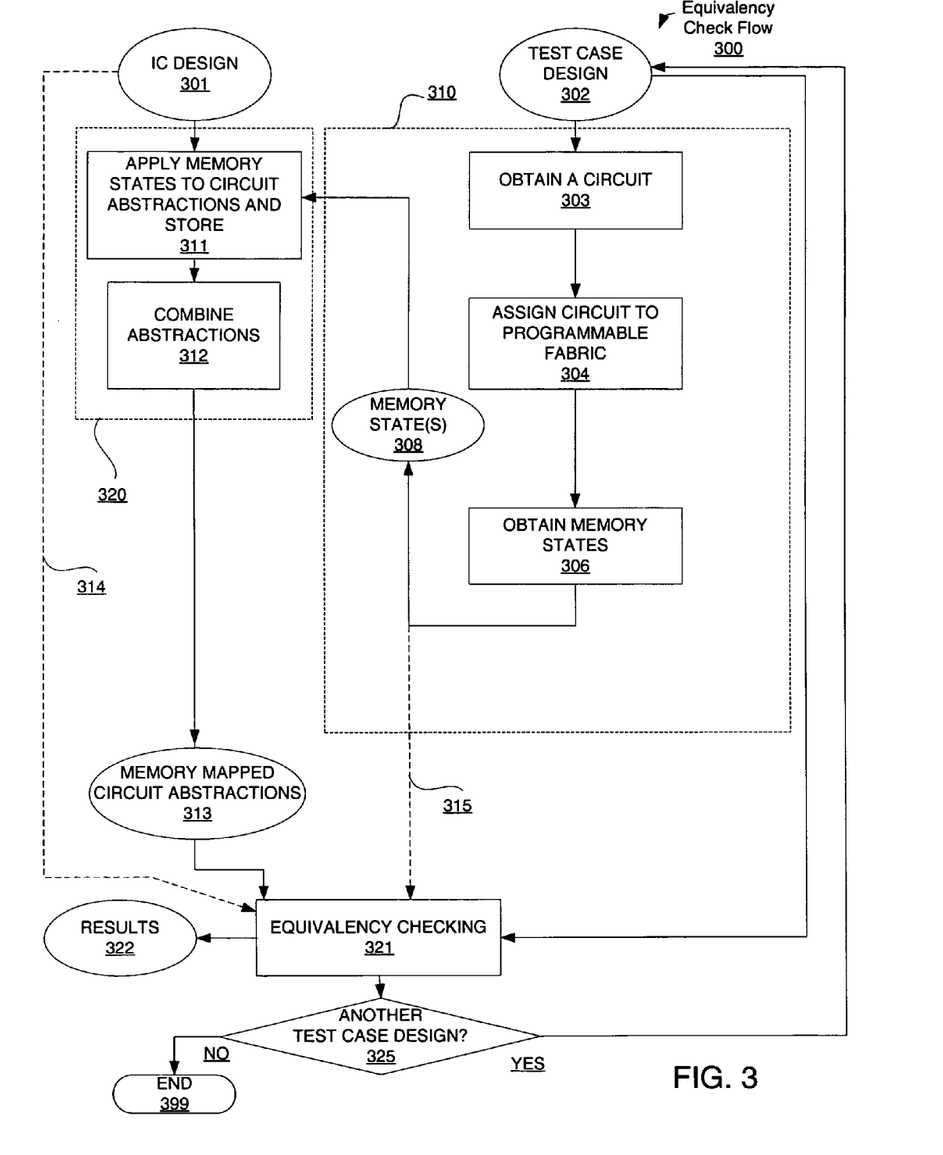
FIG. 3 depicts a flow diagram of an exemplary embodiment of an equivalency check flow for an abstraction level.

FIG. 3 depicts a flow diagram of an exemplary embodiment of an equivalency check flow 300 for a single abstraction level. Circuit abstraction portion 320 and circuit memory states portion 310 respectively receive as input IC design 301 and test case design 302, which may be respectively accessible databases. IC design 301 and test case design 302 are respectively similar to IC design 101 and test case design 102 of FIG. 2, except that they are input at a level of abstraction that may be directly input to an equivalency checker at 321.

As much of the description for FIG. 3 is the same as that provided with regard to FIG. 2, repetitive description is limited. Such an equivalency checker may accept as input one or more of transistor ("switch") level, gate level, RTL level, HDL behavioral level or system level (such as with a programming language, for example SystemC). Notably, all of equivalency check flow 300 is done at a same abstraction level.

A circuit is obtained at 303 from test case design. At 304, a circuit obtained at 303 is assigned to programmable fabric. Thus, each logic function is assigned to some portion of FPGA fabric, for example one or more CLBs and associated memory cells. This assignment may be done with PAR tools. Memory states for such a circuit are obtained at 306. Memory states 308 obtained are not necessarily abstraction-level dependent, as described above, as they may be statements, such as force statements in Verilog, to make a node have a particular state. Memory states 308 are provided to 311.

At 311, memory states are mapped to programmable logic of IC design 301. This is done at an abstraction level capable of being input to an equivalency checker at 321, alternatively abstractions may be translated to a level capable of being input to an equivalency checker at 321. Each memory-mapped abstraction for each circuit is stored at 311, until, all stored memory mapped circuit abstractions are provided to combine them at 312. Abstractions may be combined by reference to a top-level HDL netlist.

For example, output 312 may be a design- or top-level abstraction 313. Thus, hierarchical information associated with an HDL may be included to further facilitate equivalency checking at 321 by combining circuit abstractions to in effect reduce the number of Boolean equations to represent such circuit abstractions. For example, a network C may be placed in cell B, which cell B is in turn placed in cell A; this combination may be renamed and thus using network pin or port names may be used during equivalency checking to find corresponding circuits as network name may change. Furthermore, because all circuit abstractions are combined at 312 to provide a top-level abstraction 313, another opportunity for unused circuitry to drop out is afforded, especially with respect to FPGA fabric networks configured for pass-through to preserve electrical continuity.

At 321, equivalency checking is done with a Boolean expression for each test case design being compared with a top-level abstraction 313 of all test case design circuits are configured into FPGA design 301 to determine if equivalence exists. Equivalency checking uses input and output node identification, such as by pin naming convention, to determine where in top-level abstraction 313 to extract a Boolean equation for comparison with test case design 302. Included in top-level abstraction 313 is a netlist, which may be compared with an input netlist for test case design 302 to ensure pin names track.

Combined memory mapped circuit abstractions 313 are provided for equivalency checking at 321. An equivalency checker at 321 having access to test case design 302 circuits database obtains each such circuit for equivalency checking against combined memory mapped circuit abstractions 313, with comparison as previously described with respect to FIG. 2. Results from such checking are output at 322. Results 322 may be output for each check or for all checks at a time.

After equivalency checking at 321, a check for another test case design to process may be made at 325. If another test case design is to be processed, such other test case design is input at 302. If another test case design is not to be processed, equivalency check flow 300 ends at 399.

Notably, FIG. 3, is described above for a single abstraction level for clarity, but may employ two or more abstraction levels. A combination of different abstraction levels may be used, for example with an equivalency checker 321 capable of abstraction level translation for conversion into an acceptable format for comparison, or capable of comparison of circuits described with different abstraction levels, or capable of a combination of abstraction level translation and comparison at different abstraction levels.

Alternatively, abstraction may be avoided provided equivalency checking at 321 accepts level of abstraction of IC design 301 as input. In which embodiment, IC design 301 and memory states 308 are provided for equivalency checking at 321, as indicated by dashed lines 314 and 315, respectively. In which embodiment, at 321, memory states 308 are mapped onto circuits from IC design 301. Additionally, at 321, memory states 308 may be filtered for application to selected cells, as described in more detail with respect to FIG. 4.

As described with respect to FIGS. 2 and 3, each circuit of a test case design is obtained and processed. However, this may be less efficient than processing an entire test case design, having a plurality of circuits, at a time.

Figure 4:
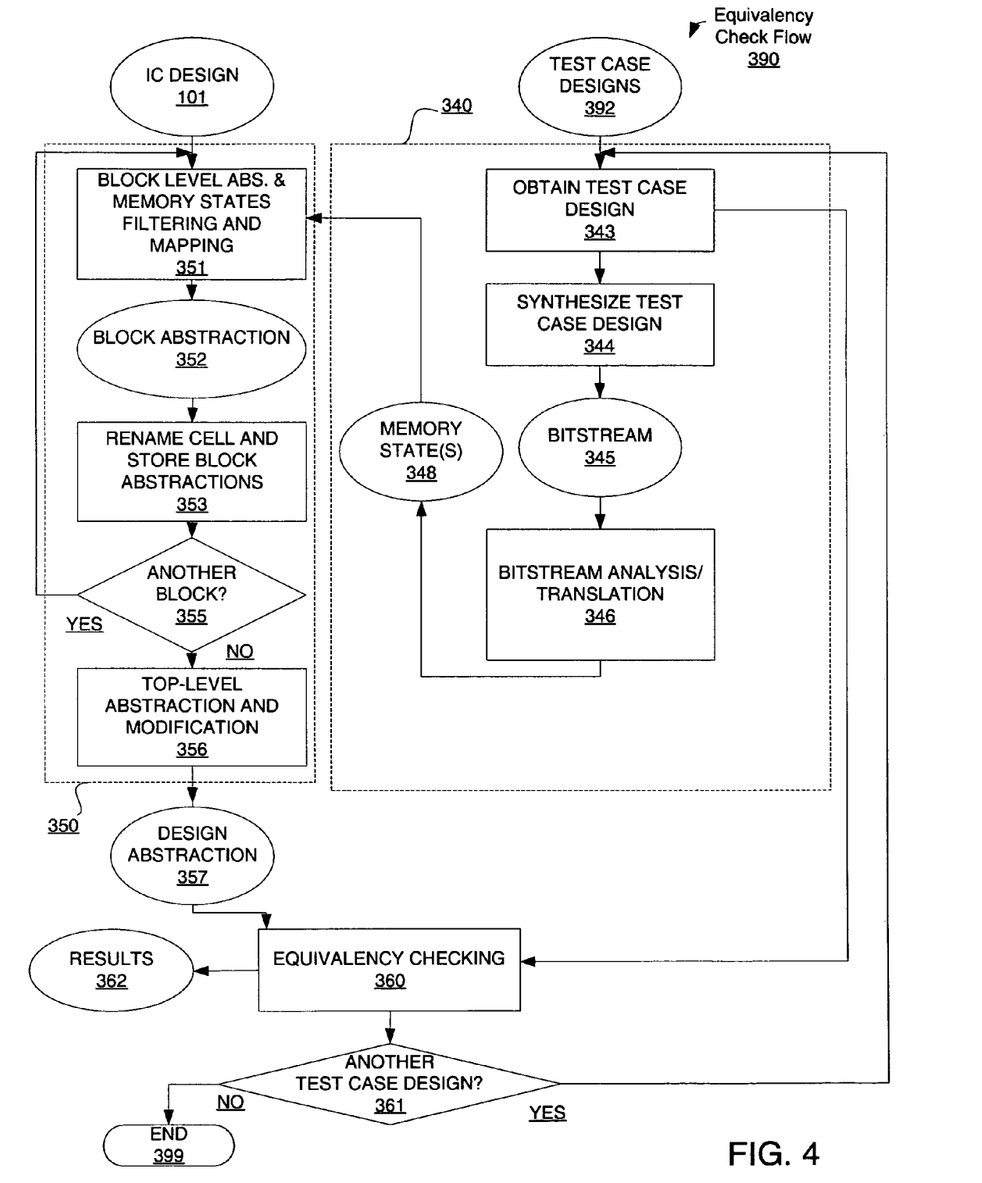
FIG. 4 depicts a block diagram of an exemplary embodiment of an equivalency check system for hierarchical processing.

FIG. 4 depicts a flow diagram of an exemplary embodiment of an equivalency check flow 390 for hierarchical processing. At 392, a test case design of one or more test case designs is provided or input. At 343, a test case design is obtained from one or more test case designs 392. This test case design obtained at 343 is synthesized at 344 to generate a bitstream 345 on which analysis and translation 346 is done to obtain memory states 346. Memory states 346 are for the test case design obtained at 343. This test case design obtained at 343 is provided to an equivalency checker at 360.

One or more logic blocks, including sub-blocks, from IC design 101 is obtained at 351 for configuring a test case design from 343. Notably, IC design 101 may be described using Verilog, and thus may include one or more "tranif" Verilog statements for reasons described below in additional detail (further details on the "tranif" Verilog statements are found in the chapter on bidirectional pass switches using "tranif0 and "tranif1" keywords in the Verilog Language Reference Manual (LRM) Chapter 7.6. At 351, a logic block is level abstracted including application of memory states 348. Notably, at 351 application of memory states 348 may be done prior to level abstraction or after level abstraction, for example using a logic synthesis tool such as Design Compiler from Synopsys, or by a logic level abstraction tool. However, for clarity, it will be assumed that at 351 level abstraction is used to apply memory states 348 though such application of memory states may be done independently from level abstraction.

At 351, memory states data is filtered to select states for each instance of an obtained logic block, namely, memory states for a logic block currently being processed. At 353, each logic block instance will use a separate cell, so a cell for the logic block is renamed. Notably, file contents for each logic block instance may be hashed at 353 to generate a name for each such logic block instance. The renaming occurs in the block cells and the cells that reference them. The top-level description is modified to reference the new cell names at 356. It is convenient to use the instance names, names associated with placement of cells, to rename the cells. Modification of hierarchy results from mapping of memory states where circuitry of a block is translated to Boolean logic equivalents, where cell-to-cell hierarchy is parsed out into separate cells. For example, heretofore, physical states of memory were set for application to CLBs, where each CLB was represented as the same circuit but with different memory states applied. However, with mapping of memory states as described, CLBs may be represented as different circuits, namely, circuits reduced down to their Boolean logic equivalent responsive to applied memory states. This substantially reduces circuit complexity, but does increase the number of names used to identify circuits. Accordingly, it should be appreciated that translated memory states are used to convert logic blocks of an IC design into a test case design, and not just a programmed physical representation of the IC design as it exists.

The term top-level includes a single cell at the top level, or to a collection of cells that can be flattened to become the top-level cell and do not contain the hierarchical blocks placed therein.

Output at 352 is a level abstraction of a logic block. This output with a renamed cell is stored at 353. At 355, a check for another logic block for configuring a test case design into IC design 101 is made. If another logic block is to be used to configure IC design 101 with a test case design from 343, then such other logic block is obtained at 351. If, at 355, no other logic block is to be used, then at 356 a top-level abstraction is done on all logic blocks stored at 353 to provide a design abstraction 357 modified to account for renamed cells. Design abstraction 357 is a hierarchical combination of logic blocks. In other words, after parsing out each cell, cells may be recombined into a hierarchical relationship.

As there may be fewer configurations for individual blocks relative to the total number of individual logic blocks (i.e., some logic blocks will have the same configuration), block abstraction runtime may be reduced using hierarchical associations as compared to abstracting an entire design at the same level ("flat abstraction"). For example, for a design using 100 CLBs, by hierarchically processing it may be found that only five variations need to be processed.

In an embodiment, an abstraction tool may be used to abstract transistor level circuits to RTL level models at 351, and then re-abstract its own output with a top-level netlist to provide a top-level RTL model abstraction at 356. For a top-level abstraction at 356, a top-level Verilog structural netlist is parsed and individual block RTL Verilog files are parsed. Accordingly, the abstraction tool reads the RTL code. As mentioned above, in order to place blocks in a top level, such blocks are renamed in both the top level and in module declarations in the blocks. This renaming is to account for a possible change in logic function due to application of constraints. It may be convenient to create the name of the abstracted block model using a hash of the configuration bitstream.

Furthermore, if such an abstraction tool is able to resolve "tranif1" and "tranif0" Verilog statements, a resulting design may be further reduced to enhance speed of equivalency checking. For example, ports may be connected together through a block or blocks. However, signals passing through one or more blocks from one port to another may have no logic operation done to them while passing within such block or blocks. To reduce design complexity, such port-to-port connectivity may therefore be represented with a "tranif1" or "tranif0" switch-level Verilog construct. A tranif1 represents a pass gate that is switched to a conductive state for a logic level high, and a tranif0 represents a pass gate that is switched to a conductive state for logic level low. "Tranif" constructs may be used for bi-directional signaling from port-to-port, as "tranif" statements allow the same signal or signal path to have two different names and allow bi-directionality. For example, a signal named to indicate it passes from port A to port B may with a "tranif" construct have a different name when it passes from port B to port A. This is because a pass gate need not be directionally dependent with respect to source and drain terminals of a transistor, and thus signaling going from source-to-drain or drain-to-source. If signaling from port-to-port is not bi-directional, a buffer or buffers may be inserted in such block or blocks instead of a pass gate or pass gates.

At 360, a design-level abstraction 357 is equivalency checked with a test case design obtained at 343. Equivalency check results 362 are output. At 361, a check for another test case design is made. If another test case design is to be processed for IC design 101, such other test case design is obtained at 343, otherwise equivalency check flow 390 ends at 399.

Figure 5:
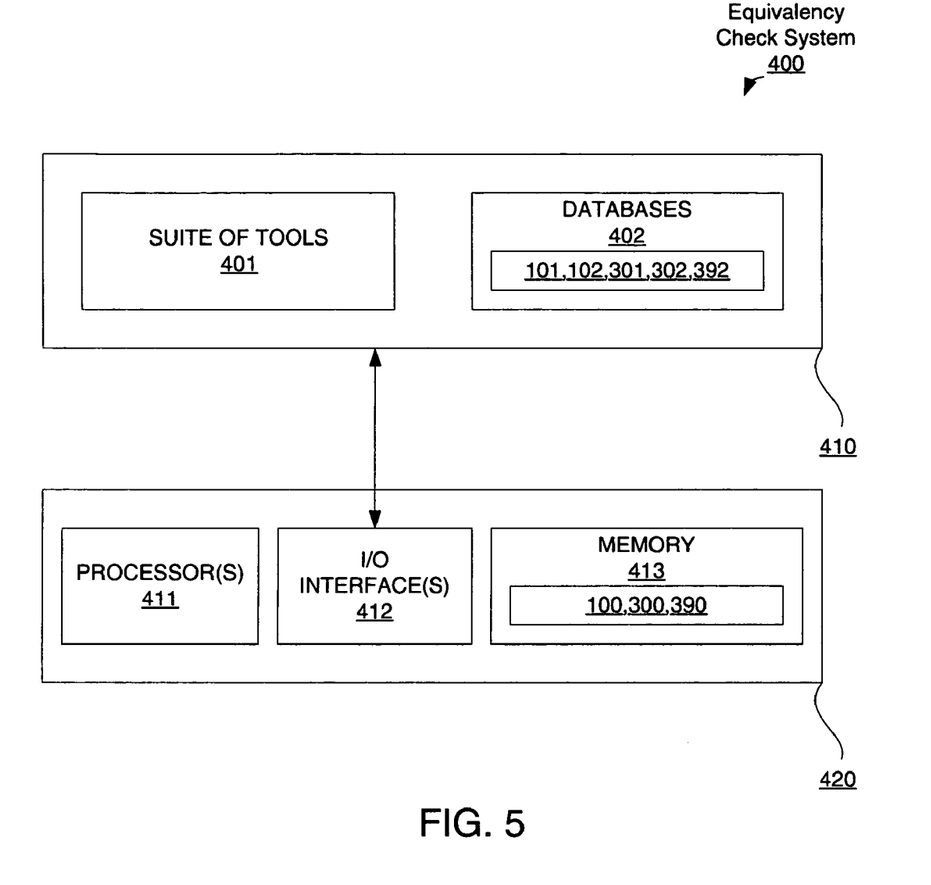
FIG. 5 depicts a block diagram of an equivalency check system.

FIG. 5 depicts a block diagram of an exemplary embodiment of an equivalency check system 400. Equivalency check system 400 comprises computer 420 having one or more of each of the following, as parallel processing may be used, processors 411, an input/output (I/O) interface 412 and memory, which may include virtual memory, 413. Memory 413 includes a one or more program products for executing instructions as described above with respect to equivalency checking flows 100, 300 or 390.

Computer 420 in operation is programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 413.

Memory 413 may include one or more of the following random access memory, read only memory, magneto-resistive read/write memory, optical read/write memory, cache memory, magnetic read/write memory, and the like, as well as other signal-bearing media as set forth below. However, for clarity, memory 413 is described as virtual memory and internal host memory. Computer 420 may be part of a computer system including known input, output and input/output devices, such as keyboard, cursor pointing device, display device, and printer, among other known devices, some of which may be networked.

Accessible by computer 420 is memory 410, such as signal-bearing media as set forth below. Memory 410 includes a suite of software tools 401 and databases 402. Databases 402 are for storing IC design 101, 301 and test case design(s) 102, 302, 392. Software tools 401 includes those software tools used for carrying out instructions as described above with respect to equivalency checking flows 100, 300 or 390. For clarity, memory 410 is mass storage memory which is distinct from internal host memory, though all or a portion of virtual memory of memory 413 may be located in memory 410.

An aspect of the invention is implemented as a program product for use with a programmed computer such as, mentioned above. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-RAM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method for checking whether a programmable logic device functions properly when programmed, comprising:
obtaining an integrated circuit design for the programmable logic device, the integrated circuit design including at least a programmable logic portion of the programmable logic device;
obtaining at least one test pattern to test at least the programmable logic portion;
obtaining memory states for configuring the programmable logic device;
applying the memory states to at least the programmable logic portion to configure the programmable logic portion with the at least one test pattern to provide a configured design; and
equivalency checking the configured design with the at least one test pattern, the equivalency checking being for equivalence of circuit abstractions of the configured design and the at least one test pattern.

2. A method as in claim 1, wherein the step of applying comprises:
filtering the memory states responsive to the programmable logic portion; and
hierarchically combining logic blocks for the at least one test pattern as configured to provide the configured design.

3. A method as in claim 1, wherein the step of applying comprises:
respectively configuring the at least one test pattern into at least one sub-block of the programmable logic portion to provide the configured design; and
storing at least one of the test pattern as configured.

4. A method as in claim 1, wherein the step of equivalency checking is done at a Boolean level.

5. A method for checking whether a programmable logic device functions properly when configured, comprising:
obtaining an integrated circuit design for the programmable logic device, the integrated circuit design represented at a first level of abstraction;
obtaining a test case design, the test case design including a plurality of individual circuits, the test case design represented at the first level of abstraction;
synthesizing each of the plurality of individual circuits to provide network nodal state information for each of the plurality of individual circuits;
obtaining memory states for each of the plurality of individual circuits from the network nodal state information;
applying the memory states to the integrated circuit design;
level abstracting the integrated circuit design with the memory states applied to provide configured circuits represented at a second level of abstraction; and
equivalency checking the configured circuits with the plurality of individual circuits, the equivalency checking being for equivalence of circuit abstractions of the configured circuits and the plurality of individual circuits.

6. A method as in claim 5, wherein the first level of abstraction is lower than the second level of abstraction.

7. A method as in claim 6, wherein the second level of abstraction is selected from gate level and register transfer level.

8. A method as in claim 7, wherein the first level is at or below a transistor level.

9. A method as in claim 5, wherein the integrated circuit design is for a programmable logic device.

10. A method as in claim 9, wherein the programmable logic device is a field programmable gate array.

11. A method as in claim 5, wherein the step of level abstracting comprises:
filtering the memory states responsive to the plurality of individual circuits; and
hierarchically combining the plurality of individual circuits as respectively configured with the memory states to provide the configured circuits as a configured design.

12. A method as in claim 11, wherein the step of level abstracting comprises:
respectively configuring each of the plurality of individual circuits into unconfigured programmable fabric of the integrated circuit design; and
storing each of the plurality of individual circuits as configured.

13. An apparatus for checking whether a programmable logic device functions properly when configured, comprising:
- database means containing an unconfigured design for the programmable logic device and test patterns;
- a placer and router for placing and routing the test patterns to provide network nodal information for the test patterns;
- means for obtaining memory states for the test patterns from the network nodal information;
- means for applying the memory states for the test patterns to the unconfigured design and for configuring a portion of the unconfigured design with the test patterns to provide a configured design; and
- an equivalency checker to compare the test patterns with the configured design, the equivalency checker being for checking equivalence of circuit abstractions of the configured design and the test patterns.

14. An apparatus as in claim 13, wherein the means for applying comprises a level abstractor configured to hierarchically assemble the test patterns.

15. An apparatus as in claim 14, wherein the means for obtaining the memory states comprises a map file input and translation to a target format.

16. An apparatus as in claim 15, wherein the means for obtaining the memory states further comprises a bitstream input.

17. An apparatus as in claim 13, wherein the equivalency checker is configurable to operate at a level of abstraction selected from transistor, gate, register transfer, behavioral and system levels.

18. A computer readable medium having a program, which when executed with a programmed computer, causes execution of a method for checking whether a programmable logic device functions properly when configured, comprising:
- accessing a first database for obtaining an unconfigured design for the programmable logic device;
- accessing a second database for obtaining test patterns;
- accessing a suite of software tools to obtain memory states for the test patterns;
- applying the memory states for the test patterns to the unconfigured design to configure at least a programmable logic portion of the unconfigured design with the test patterns to provide a configured design; and
- accessing the suite of software tools to equivalency check the test patterns with the configured design, the equivalency check being for equivalence of circuit abstractions of the configured design and the test patterns.

19. A system for testing whether a programmable logic device functions properly when configured, comprising:
- a computer including at least one processor, at least one input/output interface, and memory;
- mass storage memory accessible by the computer to store a suite of software tools and databases;
- the memory having a program which when executed by the computer causes,
    - a first database of the databases to be accessed to obtain an unprogrammed design for the programmable logic device;
    - a second database of the databases to be accessed to obtain test patterns;
    - a tool in the suite of software tools to obtain memory states for the test patterns;
    - the memory states for the test patterns to be applied to the unconfigured design to configure a programmable logic portion of the unconfigured design with the test patterns to provide a configured design; and
    - another tool in the suite of software tools to equivalency check the test patterns against the configured design to determine if the configured design is functionally equivalent to the test patterns, the equivalency check being for equivalence of circuit abstractions of the configured design and the test patterns.

20. A method for checking whether a programmable logic device functions properly when configured, comprising:
- obtaining an integrated circuit design for the programmable logic device;
- obtaining a test case design;
- synthesizing the test case design;
- obtaining memory states from the test case design synthesis;
- obtaining a first logic block from the integrated circuit design;
- configuring the first logic block with a first portion of the test case design;
- applying first information from the memory states to the logic block;
- obtaining a second logic block from the integrated circuit design;
- configuring the second logic block with a second portion of the test case design;
- applying second information from the memory states to the second logic block;
- hierarchically combining the first logic block and the second logic block to provide a design abstraction; and
- equivalency checking the design abstraction with the test case design, the equivalency checking being for equivalence of circuit abstractions of the design abstraction and the test case design.

21. A method as in claim 20, wherein the steps of configuring the first logic block and applying the first information are done with level abstraction.

22. A method as in claim 20, wherein the step of configuring the first logic block is done with level abstraction, and wherein the step of applying the first information is done with logic synthesis.

23. A method as in claim 22, wherein the logic synthesis is done prior to the level abstraction.

24. A method as in claim 22, wherein the logic synthesis is done after the level abstraction.

25. A method for checking whether a programmable logic device functions properly when configured, comprising:
- obtaining a first logic block;
- obtaining memory states;
- filtering the memory states responsive to the first logic block to provide first filtered memory states;
- translating the first filtered memory states to the first logic block;
- parsing out a first cell of the first logic block from a hierarchical relationship with a second cell; and
- renaming the first cell of the first logic block.

26. A method as in claim 25, further comprising:
- obtaining a second logic block;
- filtering the memory states responsive to the second logic block to provide second filtered memory states;
- translating the second filtered memory states to the second logic block;
- parsing out the second cell from the hierarchical relationship; and
- renaming the second cell of the second logic block.

27. A method as in claim 26, further comprising:
combining the first cell as renamed and the second cell as renamed into the hierarchical relationship.

28. A method as in claim 27, wherein the translating the first filtered memory states to the first logic block comprises abstracting the first logic block to a register-transfer-level model.

29. A method as in claim 28, wherein the combining into the hierarchical relationship comprises re-abstracting the register-transfer-level model with a top-level netlist to provide a top-level register-transfer-level model.

30. A method as in claim 29, wherein the first logic block is described in Verilog including at least one tranif Verilog statement.

31. A method as in claim 30, wherein the re-abstracting comprises using the at least one tranif Verilog statement to provide for bi-directional port-to-port signaling having no logical operations.

* * * * *